(12) United States Patent
Zhang et al.

(10) Patent No.: US 12,210,252 B2
(45) Date of Patent: Jan. 28, 2025

(54) ARRAY SUBSTRATE AND MANUFACTURING METHOD THEREFOR, AND DISPLAY PANEL

(71) Applicants: INFOVISION OPTOELECTRONICS (KUNSHAN) CO., LTD., Suzhou (CN); PEKING UNIVERSITY SHENZHEN GRADUATE SCHOOL, Shenzhen (CN)

(72) Inventors: Shengdong Zhang, Suzhou (CN); Xiaoliang Zhou, Suzhou (CN); Congwei Liao, Suzhou (CN); Qingping Lin, Suzhou (CN); Huan Yang, Suzhou (CN); Zhongfei Zou, Suzhou (CN); Te-Chen Chung, Suzhou (CN)

(73) Assignees: INFOVISION OPTOELECTRONICS (KUNSHAN) CO., LTD., Suzhou (CN); PEKING UNIVERSITY SHENZHEN GRADUATE SCHOOL, Shenzhen (CN)

( * ) Notice: Subject to any disclaimer, the term of this patent is extended or adjusted under 35 U.S.C. 154(b) by 0 days.

(21) Appl. No.: 18/560,676

(22) PCT Filed: Dec. 17, 2021

(86) PCT No.: PCT/CN2021/139120
§ 371 (c)(1),
(2) Date: Nov. 13, 2023

(87) PCT Pub. No.: WO2023/108608
PCT Pub. Date: Jun. 22, 2023

(65) Prior Publication Data
US 2024/0248353 A1    Jul. 25, 2024

(51) Int. Cl.
*G02F 1/136* (2006.01)
*G02F 1/1343* (2006.01)
(Continued)

(52) U.S. Cl.
CPC ...... *G02F 1/13606* (2021.01); *G02F 1/13439* (2013.01); *G02F 1/136295* (2021.01);
(Continued)

(58) Field of Classification Search
CPC ............ G02F 1/13606; G02F 1/13439; G02F 1/136295; G02F 1/1368; H01L 27/124; H01L 27/1288
See application file for complete search history.

(56) References Cited

U.S. PATENT DOCUMENTS

2008/0035920 A1* 2/2008 Takechi ............... H01L 29/7869
257/43
2009/0305473 A1 12/2009 Luo et al.
(Continued)

FOREIGN PATENT DOCUMENTS

CN     1975544 A     6/2007
CN     106783953 A    5/2017
(Continued)

*Primary Examiner* — James A Dudek
(74) *Attorney, Agent, or Firm* — Cheng-Ju Chiang

(57) ABSTRACT

An array substrate and a manufacturing method therefor, and a display panel are provided. The manufacturing method includes: forming a scan line and a gate on a substrate; forming a first insulating layer covering the scan line and the gate on the substrate; forming a metal oxide semiconductor layer above the first insulating layer, the metal oxide semiconductor layer including a source, a drain and an active layer; coating an upper surface of the metal oxide semiconductor layer with a photosensitive material layer; photoetching the photosensitive material layer from the back side of the substrate by using a first metal layer as a mask to form a channel protection layer; performing conductorization treatment on the metal oxide semiconductor layer to enable the source and the drain to be conductive; forming a data line
(Continued)

above the first insulating layer; and forming a pixel electrode above the first insulating layer.

20 Claims, 11 Drawing Sheets

(51) Int. Cl.
G02F 1/1362 (2006.01)
G02F 1/1368 (2006.01)
H01L 27/12 (2006.01)

(52) U.S. Cl.
CPC .......... *G02F 1/1368* (2013.01); *H01L 27/124* (2013.01); *H01L 27/1288* (2013.01)

(56) References Cited

U.S. PATENT DOCUMENTS

2010/0295042 A1 11/2010 Yano et al.
2016/0268444 A1 9/2016 Fang et al.

FOREIGN PATENT DOCUMENTS

JP 2010-165961 A 7/2010
JP 2013-12610 A 1/2013

* cited by examiner

ARRAY SUBSTRATE AND MANUFACTURING METHOD THEREFOR, AND DISPLAY PANEL

CROSS REFERENCE TO RELATED APPLICATIONS

This application is a 35 U.S.C. § 371 National Phase conversion of International (PCT) Patent Application No. PCT/CN2021/139120, filed on Dec. 17, 2021. The PCT International Patent Application was filed and published in Chinese.

BACKGROUND OF THE APPLICATION

Field of the Application

The present application relates to the field of display technology, and in particular, to an array substrate and a manufacturing method thereof, and a display panel.

Description of Related Art

With the development of display technology, thin and lightweight display panels are very popular among consumers, especially thin and lightweight liquid crystal display panels (LCD).

An existing display device includes a thin film transistor array substrate (TFT array substrate), a color filter substrate (CF substrate) and liquid crystal molecules filled between the TFT array substrate and the CF substrate. During operation of the display device, driving voltages are respectively applied to the pixel electrode of the TFT array substrate and the common electrode of the CF substrate, or driving voltages are respectively applied to the common electrode and the pixel electrode of the TFT array substrate, to control the rotation direction of the liquid crystal molecules between the two substrates, so as to refract the backlight provided by a backlight module of the display device, thereby displaying the pictures.

Oxide thin film transistors (TFTs) in the prior art have advantages of excellent electrical performance, large area manufacturing uniformity, and low manufacturing cost, and are expected to be applied for various flat panel display products. When applied to LCD display panels, the gate of the bottom gate TFT can be used as a light shielding layer to prevent degradation of the TFT's characteristics due to the oxide active layer being illuminated. The commonly used bottom gate oxide TFTs mainly include back-channel etching (BCE) type and etching stopper layer (ESL) type. The manufacturing process of BCE type TFT is simpler. However, due to the need to consider the alignment between the gate, the source/drain and the ESL layer, the length of the gate cannot be shortened, the overlapping area between the gate and the source/drain is large, and the parasitic capacitance of the TFT is large, but the ESL layer can protect the active layer, resulting in better characteristics and stability of the TFT. In addition, the bottom gate homojunction TFT is another optional structure, which has the same process complexity and gate length as BCE type TFT, and the active layer is protected by a channel protection layer, making it more conducive to obtaining good characteristics and stability. The bottom gate homojunction TFT is expected to combine the advantages of BCE type TFT and ESL type TFT.

However, the channel protection layer of the bottom gate homojunction TFT is typically made of silicon oxide (SiOx) or silicon nitride (SiNx). The bottom gate homojunction TFT requires a separate etching process to produce the channel protection layer (PL), including film formation, photolithography, etching, photoresist removal, and cleaning, to achieve patterning. The process steps are relatively complex, and the deposition process of inorganic PL layer is easy to affect the oxide active layer. For example, during PECVD (plasma enhanced chemical vapor deposition) film formation, excessive hydrogen is introduced into the active layer, while during sputtering film formation, surface damage is caused due to ion bombardment, thus affecting the TFT performance. Further, the overlapping area between the gate and the source/drain determines the parasitic capacitance of the TFT, and the overlapping area is determined by the alignment between the PL layer and the gate, making it difficult to reduce the parasitic capacitance.

BRIEF SUMMARY OF THE APPLICATION

In order to overcome the shortcomings and deficiencies in the prior art, the object of the present application is to provide an array substrate, a manufacturing method thereof and a display panel, so as to solve the problem that the performance of the active layer is affected when the channel protection layer is manufactured in the prior art, and the parasitic capacitance generated between the gate and the source/drain is large.

The object of the present application is realized by the following technical solutions:

The present application provides a manufacturing method of an array substrate, including:
  providing a substrate;
  forming a first metal layer on the substrate, and etching the first metal layer, such that the first metal layer is patterned to form a scan line and a gate, and the gate is electrically connected with the scan line;
  forming a first insulating layer covering the scan line and the gate on the substrate;
  forming a metal oxide semiconductor layer on the first insulating layer;
  etching the metal oxide semiconductor layer, such that the metal oxide semiconductor layer is patterned to form a source, a drain and an active layer, wherein the source and the drain are electrically connected through the active layer;
  coating a photosensitive material layer on an upper surface of the metal oxide semiconductor layer;
  using the first metal layer as a mask to photoetch the photosensitive material layer from the side of the substrate away from the photosensitive material layer, such that the photosensitive material layer is patterned to form a channel protection layer;
  performing a conductorization treatment to the metal oxide semiconductor layer using the channel protection layer as a shelter, such that the areas of the metal oxide semiconductor layer corresponding to the source and the drain are made conductive;
  forming a second metal layer above the first insulating layer, and etching the second metal layer, such that the second metal layer is patterned to form a data line, and the data line is electrically connected with the source;
  forming a pixel electrode above the first insulating layer, wherein the pixel electrode is electrically connected with the drain.

Further, before the metal oxide semiconductor layer is etched, the photosensitive material layer is coated on the upper surface of the metal oxide semiconductor layer;

the photosensitive material layer is photoetched for the first time, such that the photosensitive material layer forms an etching stopper layer;

the metal oxide semiconductor layer is etched using the etching stopper layer as a shelter, such that the metal oxide semiconductor layer is patterned to form the source, the drain and the active layer, wherein the source and the drain are electrically connected through the active layer;

using the first metal layer as a shelter, the photosensitive material layer is photoetched for the second time from the side of the substrate away from the photosensitive material layer, such that the photosensitive material layer is patterned to form the channel protection layer.

Further, after the metal oxide semiconductor layer is formed on the first insulating layer, the metal oxide semiconductor layer is etched by an etching process, such that the metal oxide semiconductor layer is patterned to form the source, the drain and the active layer, wherein the source and the drain are electrically connected through the active layer;

the photosensitive material layer is coated on an upper surface of the etched metal oxide semiconductor layer, and the photosensitive material layer is photoetched from the side of the substrate away from the photosensitive material layer using the first metal layer as a mask, such that the photosensitive material layer is patterned to form the channel protection layer.

Further, the specific steps of performing the conductorization treatment to the metal oxide semiconductor layer include:

the metal oxide semiconductor layer is performed by a plasma treatment using the channel protection layer as a shelter.

Further, the specific steps of performing the conductorization treatment to the metal oxide semiconductor layer include:

after the photosensitive material layer is patterned to form the channel protection layer, a chemical vapor deposition process is used to form a second insulating layer on the upper surface of the metal oxide semiconductor layer, and during the formation of the second insulating layer, hydrogen is introduced into the exposed area of the metal oxide semiconductor layer, such that the areas of the metal oxide semiconductor layer contacting with the second insulating layer are made conductive by hydrogen doping.

Further, the metal oxide semiconductor layer is made of transparent metal oxide semiconductor material, when the metal oxide semiconductor layer is etched, the metal oxide semiconductor layer is also patterned to form the pixel electrode, and the pixel electrode is electrically connected with the drain;

when performing the conductorization treatment to the metal oxide semiconductor layer, the areas of the metal oxide semiconductor layer corresponding to the source, the drain and the pixel electrode are made conductive.

Further, the pixel electrode and the metal oxide semiconductor layer are located on different layers.

Further, before forming the metal oxide semiconductor layer on the first insulating layer, the second metal layer is formed on an upper surface of the first insulating layer, and the second metal layer is etched and patterned to form the data line;

after forming the data line, the metal oxide semiconductor layer is formed on the upper surface of the first insulating layer, and the metal oxide semiconductor layer covers the data line;

the metal oxide semiconductor layer is etched such that the metal oxide semiconductor layer is patterned to form the source, the drain and the active layer, wherein the source and the drain are electrically connected through the active layer, and the source is electrically connected with the data line.

Further, after performing the conductorization treatment to the metal oxide semiconductor layer, the second metal layer is formed on the upper surface of the metal oxide semiconductor layer, the second metal layer is etched and patterned to form the data line, wherein the data line is electrically connected with the source.

Further, after performing the conductorization treatment to the metal oxide semiconductor layer, a second insulating layer is formed on the upper surface of the metal oxide semiconductor layer;

the second metal layer is formed on an upper surface of the second insulating layer, the second metal layer is etched and patterned to form the data line, wherein the data line is electrically connected with the source.

Further, a transparent conductive layer is formed above the first insulating layer, and the transparent conductive layer is etched such that the transparent conductive layer forms a common electrode, wherein the common electrode and the pixel electrode are mutually insulated.

Further, the common electrode is located above the pixel electrode, and the common electrode has a slit structure.

The present application further provides an array substrate, which is manufactured by the manufacturing method as described above.

The present application further provides a display panel, including an array substrate as described above, an opposite substrate disposed opposite to the array substrate, and a liquid crystal layer arranged between the array substrate and the opposite substrate.

The channel protection layer is made of a photosensitive material. The formation of the photosensitive material layer only requires the coating process, not the chemical vapor deposition process. When the photosensitive material layer is coated, the performance of the active layer is not affected, which is beneficial for maintaining the TFT's characteristics and stability in different environments. In addition, the first metal layer is used as a mask to photoetch the photosensitive material layer from the back side of the substrate, and no additional mask is required, so that the manufacturing process is simple, the gate and the source/drain basically have no overlapping area, and the parasitic capacitance is small, which has less impact on the image display.

DETAILED DESCRIPTION OF THE APPLICATION

In order to further illustrate the technical solutions and effects of the present application to achieve its intended purpose, the following describes the specific implementation mode, structures, features and effects of the present application in combination with the drawings and the preferred embodiments as follows.

First Embodiment

Figure 1:
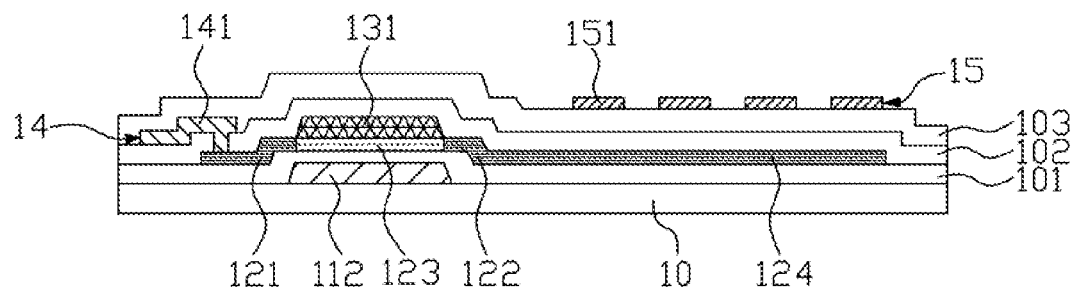
FIG. 1 is a cross-sectional view of the array substrate in the first embodiment of the present application.
Figure 2A:
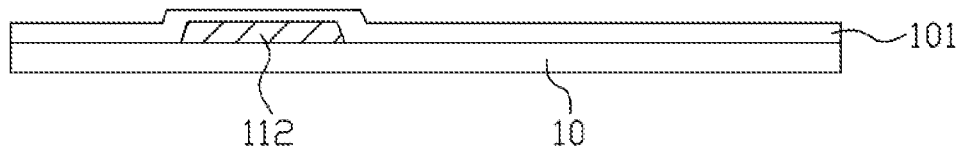
FIGS. 2a-2h are cross-sectional views when manufacturing the array substrate in the first embodiment of the present application.
Figure 3A:
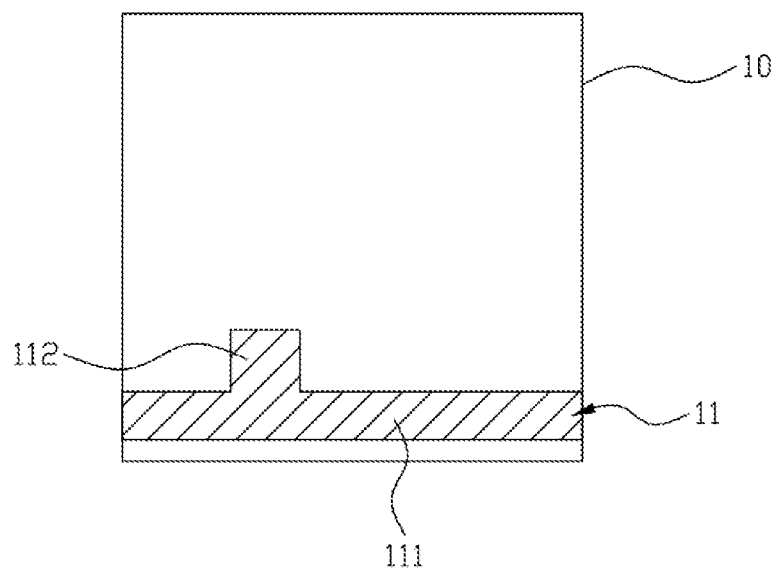
FIGS. 3a-3f are plan views when manufacturing the array substrate in the first embodiment of the present application.

FIG. 1 is a cross-sectional view of the array substrate in the first embodiment of the present application, FIGS. 2a-2h are cross-sectional views when manufacturing the array substrate in the first embodiment of the present application, and FIGS. 3a-3f are plan views when manufacturing the array substrate in the first embodiment of the present application. As shown in FIGS. 1 to 3f, the manufacturing method of an array substrate provided in the first embodiment of the present application includes:

As shown in FIGS. 2a and 3a, a substrate 10 is provided. The substrate 10 can be made of glass, quartz, silicon, acrylic acid, polycarbonate, etc., and the substrate 10 can also be a flexible substrate. Suitable materials for the flexible substrate include, for example, polyethersulfone (PES), polyethylene naphthalate (PEN), polyethylene (PE), polyimide (PI), polyvinyl chloride (PVC), polyethylene terephthalate (PET) or a combination thereof.

A first metal layer 11 (FIG. 3a) is formed on the substrate 10, and the first metal layer 11 is etched, such that the first metal layer 11 is patterned to form a scan line 111 (FIG. 3a) and a gate 112, and the gate is electrically connected with the scan line 111. The specific steps of etching the first metal layer 11 include: coating photoresist, exposing with a mask, developing, etching, and removing photoresist, etc. The first metal layer 11 can be made of metals, such as copper (Cu), silver (Ag), chromium (Cr), molybdenum (Mo), aluminum (Al), titanium (Ti), manganese (Mn), nickel (Ni), etc., or a combination of the above metals, such as Al/Mo, Cu/Mo, etc.

A first insulating layer 101 covering the scan line 111 and the gate 112 is formed on the substrate 10. The first insulating layer 101 is a gate insulating layer, and the first insulating layer 101 is arranged on the whole surface of the substrate 10 and covers the gate 112 and the scan line 111. The material of the first insulating layer 101 is silicon oxide (SiOx), silicon nitride (SiNx) or a combination of the two.

Figure 2B:
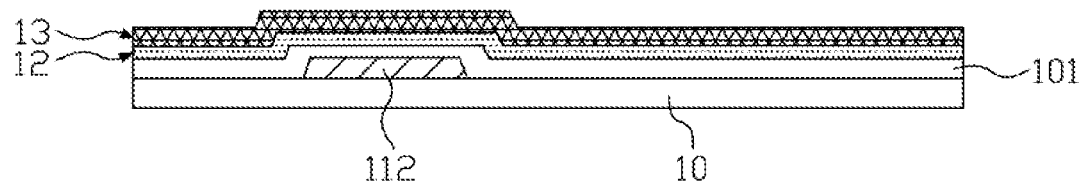

In this embodiment, as shown in FIG. 2b, a metal oxide semiconductor layer 12 is formed on the upper surface of the first insulating layer 101. Before etching the metal oxide semiconductor layer 12, a photosensitive material layer 13 is coated on the upper surface of the metal oxide semiconductor layer 12, that is, after the metal oxide semiconductor layer 12 is formed on the upper surface of the first insulating layer 101, then a photosensitive material layer 13 is coated on the upper surface of the metal oxide semiconductor layer 12. The photosensitive material layer 13 adopts positive photosensitive polyimide materials, such as positive photosensitive polyimide photoresist, and the thickness of the photosensitive material layer 13 is preferably 200 nm to 3000 nm. Specifically, the coating process is quite different from the chemical vapor deposition (CVD) process or plasma enhanced chemical vapor deposition (PECVD) process. The coating process is to cover the photosensitive material on the metal oxide semiconductor layer 12 by roller, rotary coating or other physical methods, which will not affect the properties of the metal oxide semiconductor layer 12, and is conducive to the TFT characteristics and stability not being affected by the environment.

In this embodiment, the metal oxide semiconductor layer 12 is preferably made of transparent metal oxide semiconductor materials, such as indium zinc oxide (InZnO), indium gallium oxide (InGaO), indium tin oxide (InSnO), zinc tin oxide (ZnSnO), gallium tin oxide (GaSnO), gallium zinc oxide (GaZnO), indium gallium zinc oxide (IGZO) or indium gallium zinc oxide (IGZTO). When the metal oxide semiconductor layer 12 is etched, the metal oxide semiconductor layer 12 is also patterned to form a pixel electrode 124, and the pixel electrode 124 is directly electrically connected with the drain 122. That is, in this embodiment, the pixel electrode 124, the source 121, the drain 122 and the active layer 123 are located on the same layer, and are all formed by etching the metal oxide semiconductor layer 12.

Figure 2C:
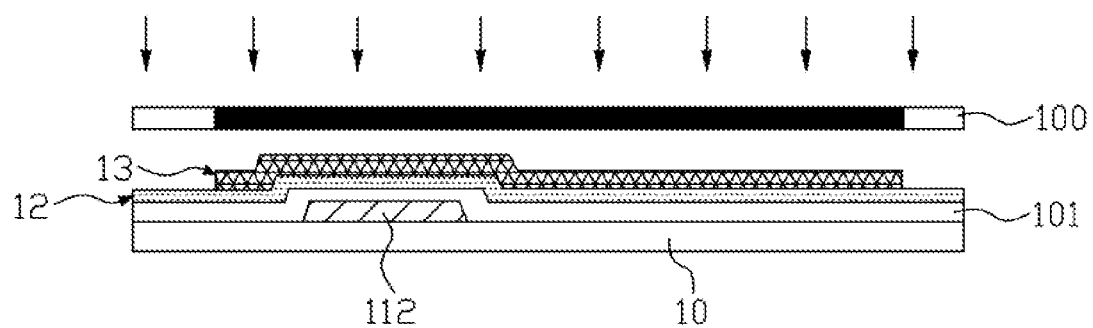

As shown in FIG. 2c, the photosensitive material layer 13 is photoetched for the first time (that is, including exposure and development), and the photosensitive material layer 13 is patterned to form an etching stopper layer 130. Specifically, this etching process includes the steps of exposing and developing the photosensitive material layer 13 by using a mask 100 over the photosensitive material layer 13. Since the photosensitive material layer 13 is made of positive photosensitive polyimide materials, the first photoetching of the photosensitive material layer 13 requires only exposure and development processes, without additional coating of photoresist and photoresist removal processes, thereby simplifying the production process.

Figure 2D:
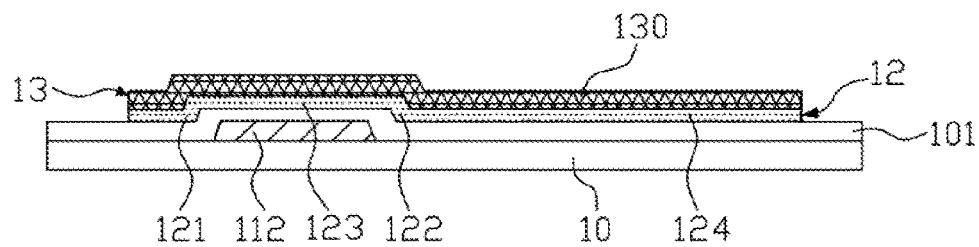
Figure 3B:
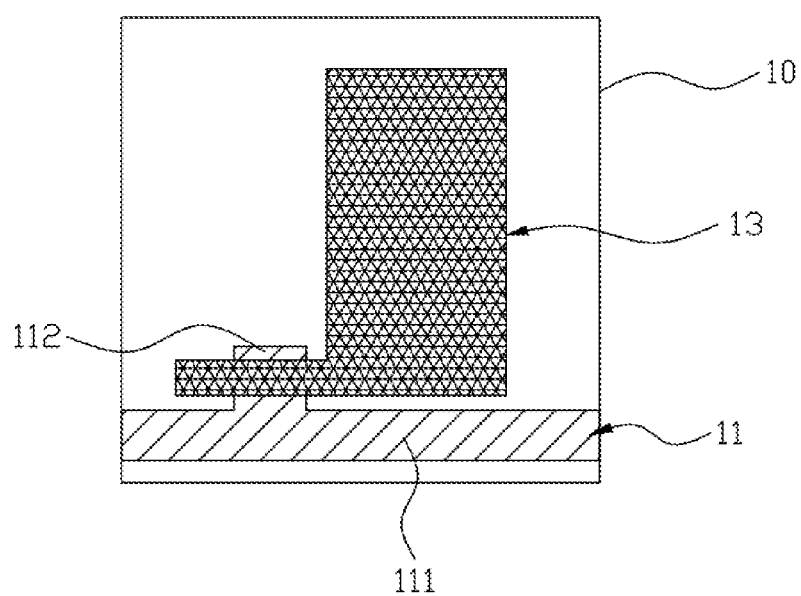

As shown in FIGS. 2d and 3b, the metal oxide semiconductor layer 12 is etched with the etching stopper layer 130 as a shelter, and the metal oxide semiconductor layer 12 is patterned to form a source 121, a drain 122 and an active layer 123. The source 121 and the drain 122 are electrically connected through the active layer 123. Thus, when the metal oxide semiconductor layer 12 is etched, no additional processes such as coating photoresist and removing photoresist are required, and the production process is simplified.

Figure 2E:
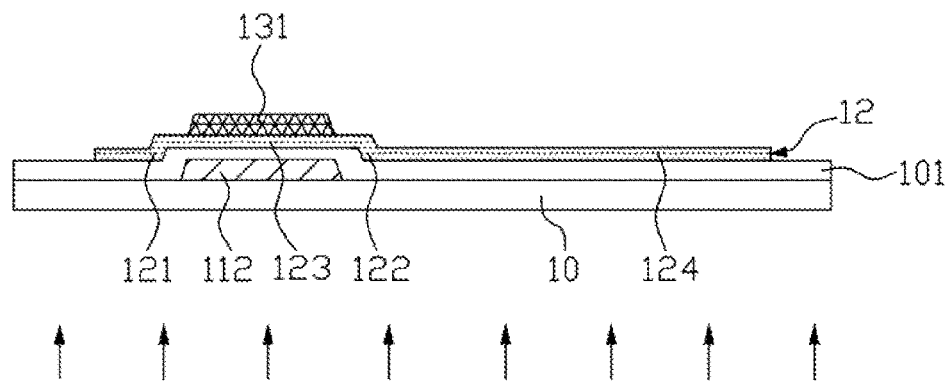
Figure 3C:
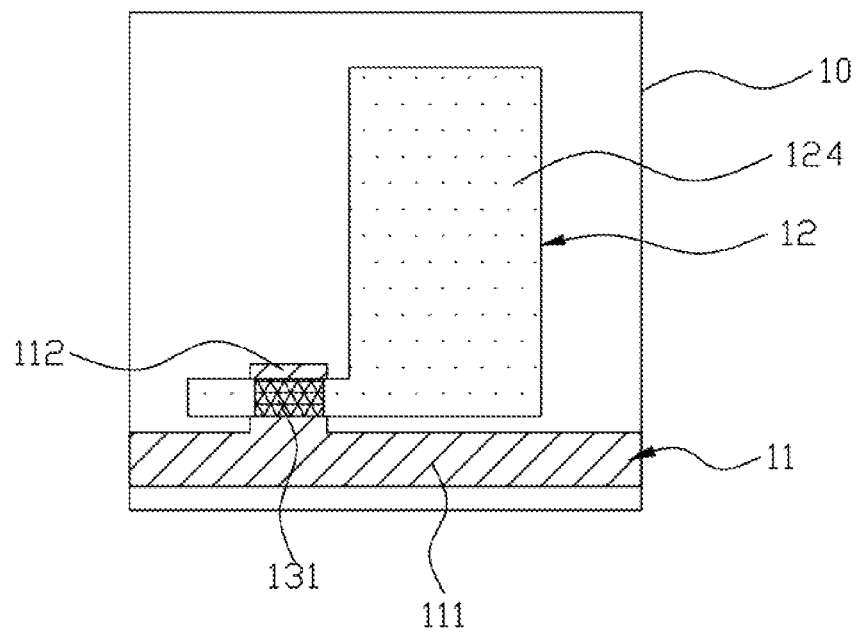

As shown in FIGS. 2e and 3c, the photosensitive material layer 13 is photoetched for the second time (specifically including exposure and development) from the side of the substrate 10 away from the photosensitive material layer 13 (i.e., the back side of the substrate 10), with the gate 112 as a shelter, so that the photosensitive material layer 13 forms a channel protection layer 131 at the position corresponding to the gate 112. That is, the gate 112 is used as a shelter to photoetch the photosensitive material layer 13 from the side of the substrate 10 away from the photosensitive material layer 13, so that the photosensitive material layer 13 is finally patterned to form a channel protection layer 131. After the second photoetching of the photosensitive material layer 13, the areas of the photosensitive material layer 13 corresponding to the positions of the source 121, the drain 122 and the pixel electrode 124 are removed, so that the source 121, the drain 122 and the pixel electrode 124 are exposed, but the active layer 123 is covered by the channel protection layer 131. In this embodiment, the gate 112 is used as a shelter, which can save a mask and simplify the manufacturing process. In addition, the gate 112 basically has no overlapping area with the source 121 or the drain 122, and the parasitic capacitance is small, which has less impact on the image display. Further, after the channel protection layer 131 is formed, the channel protection layer 131 is baked to accelerate the curing of the channel protection layer 131.

Figure 2F:
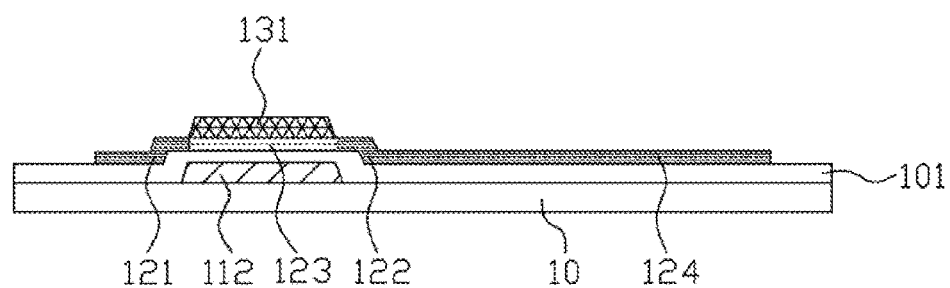
Figure 3D:
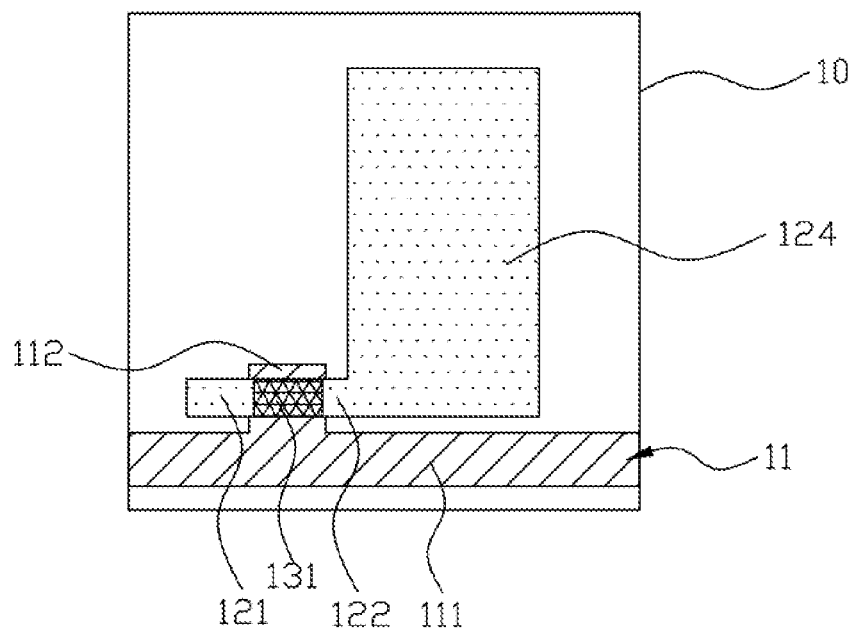

As shown in FIGS. 2f and 3d, a conductorization treatment is performed to the exposed area of the metal oxide semiconductor layer 12 (that is, the areas not covered by the channel protection layer 131), so that the areas of the metal oxide semiconductor layer 12 corresponding to the source 121, the drain 122 and the pixel electrode 124 are made conductive. Specifically, with the channel protection layer 131 as the shelter, the exposed area of the metal oxide semiconductor layer 12 is executed by the conductorization treatment, so that the areas of the metal oxide semiconductor layer 12 corresponding to the source 121, the drain 122 and the pixel electrode 124 are made conductive.

In this embodiment, the specific steps of performing a conductorization treatment to the exposed area of the metal oxide semiconductor layer 12 include: using the channel protection layer 131 as a shelter, applying a plasma treatment to the exposed area of the metal oxide semiconductor layer 12, so that the metal oxide semiconductor layer 12 not covered by the channel protection layer 131 is made conductive through ion bombardment or hydrogen doping, that is, the source 121, the drain 122 and the pixel electrode 124 are made conductive.

Since the active layer 123 is covered by the channel protection layer 131, and the channel protection layer 131 has a good hydrogen blocking ability, which is conducive to avoiding the introduction of hydrogen into the active layer 123 during the process of making the metal oxide semiconductor layer 12 conductive, thereby preventing the active layer 123 from being conductive.

Figure 2G:
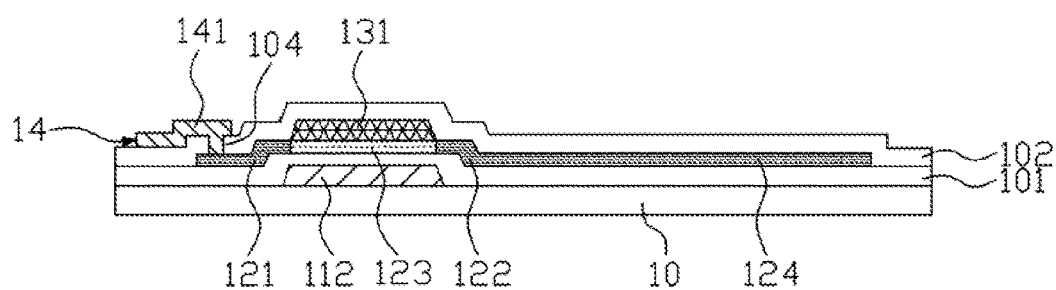
Figure 3E:
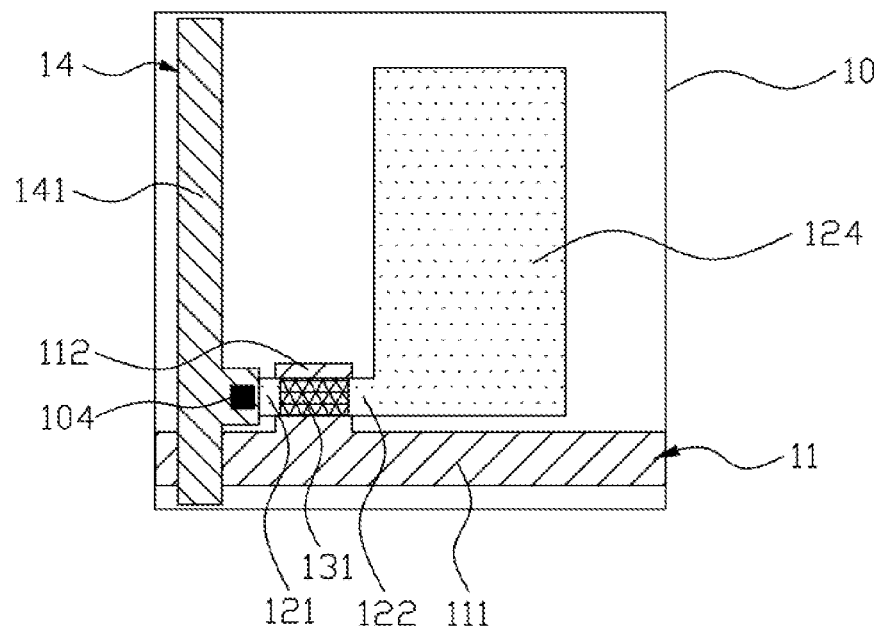

As shown in FIGS. 2g and 3e, after performing the conductorization treatment to the metal oxide semiconductor layer 12, a second metal layer 14 is formed above the metal oxide semiconductor layer 12, the second metal layer 14 is etched and patterned to form a data line 141, and the data line 141 is electrically connected with the source 121. Specifically, after performing the conductorization treatment to the metal oxide semiconductor layer 12, a second insulating layer 102 is formed on the first insulating layer 101, and the second insulating layer 102 covers the upper surfaces of the channel protection layer 131, the source 121, the drain 122, the pixel electrode 124 and the first insulating layer 101; then, the second insulating layer 102 is etched and perforated at the position corresponding to the source 121, so that the second insulating layer 102 forms a contact hole 104 at the position corresponding to the source 121; thereafter, a second metal layer 14 is formed on the upper surface of the second insulating layer 102, the second metal layer 14 is filled into the contact hole 104 and contacts the source 121, the second metal layer 14 is etched and patterned to form a data line 141, and the data line 141 is electrically connected with the source 121. Specifically, the second metal layer 14 can be made of metals, such as copper (Cu), silver (Ag), chromium (Cr), molybdenum (Mo), aluminum (Al), titanium (Ti), manganese (Mn), nickel (Ni), etc., or a combination of the above metals, such as Al/Mo, Cu/Mo, etc. The second insulating layer 102 is made of silicon oxide (SiOx), silicon nitride (SiNx) or a combination of the two. The specific steps of etching the second insulating layer 102 and the second metal layer 14 include: coating photoresist, exposing with a mask, developing, etching, and removing photoresist, etc.

Figure 2H:
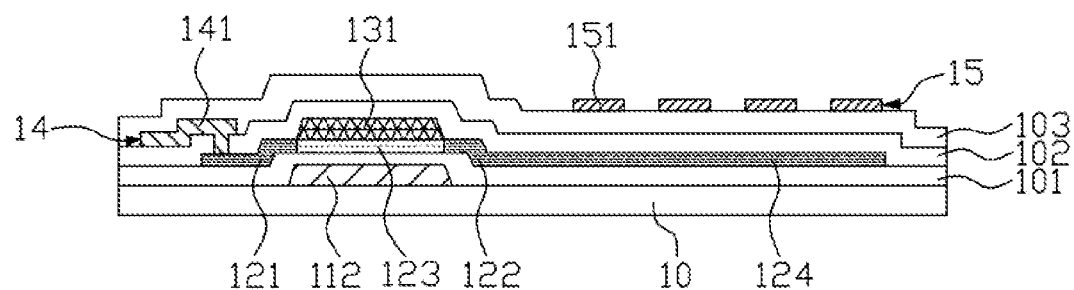
Figure 3F:
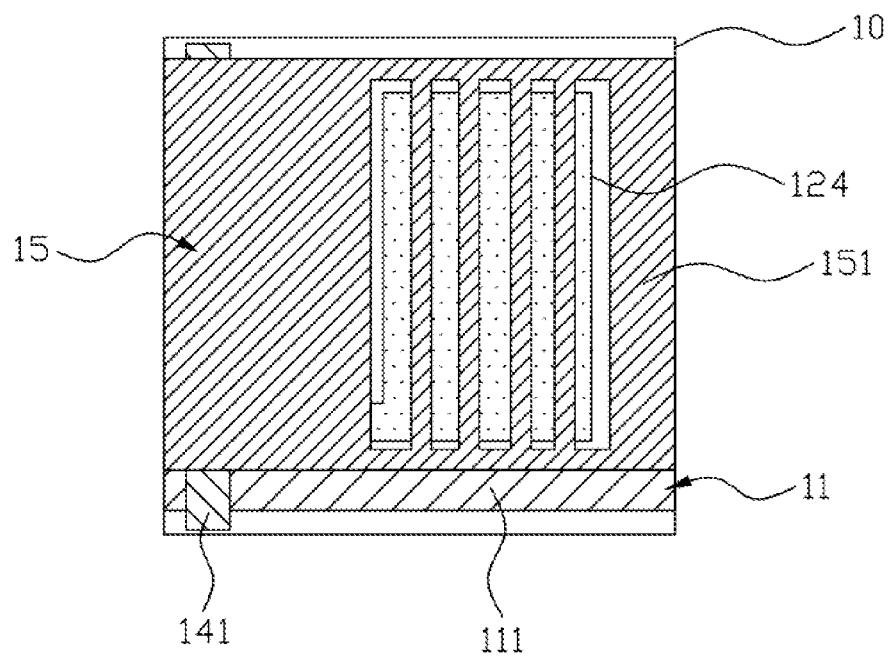

As shown in FIGS. 2h and 3f, a third insulating layer 103 is formed on the upper surface of the second insulating layer 102, and the third insulating layer 103 covers the data line 141. Then, a transparent conductive layer 15 is formed on the third insulating layer 103, and the transparent conductive layer 15 is etched to form a common electrode 151, and the common electrode 151 is insulated from the pixel electrode 124. Specifically, the common electrode 151 has a slit structure in the area corresponding to the pixel electrode 124, and the common electrode 151 and the pixel electrode 124 are separated from each other by the second insulating layer 102 and the third insulating layer 103, so that the array substrate can be applied to the display of fringe field switching (FFS) mode. Specifically, the material of the third insulating layer 103 is silicon oxide (SiOx), silicon nitride (SiNx) or a combination of the two. The transparent conductive layer 15 is made of indium tin oxide (ITO), indium zinc oxide (IZO), cadmium tin oxide (CTO), aluminum zinc oxide (AZO), indium tin zinc oxide (ITZO), zinc oxide (ZnO), cadmium oxide (CdO), hafnium oxide (HfO), indium gallium zinc oxide (InGaZnO), indium gallium zinc magnesium oxide (InGaZnMgO), indium gallium magnesium oxide (InGaMgO), or indium gallium aluminum oxide (InGaAlO). The specific steps of etching the transparent conductive layer 15 include: coating photoresist, exposing with a mask, developing, etching, and removing photoresist, etc.

In other embodiments, the common electrode 151 can also be set on the lower side of the pixel electrode 124. Alternatively, it is not necessary to set a common electrode 151 on the array substrate, so that the array substrate can be suitable for the display of TN or VA mode.

Specifically, the direction of the substrate 10 toward the first metal layer 11 is the upward direction, and the direction of the substrate 10 away from the first metal layer 11 is the downward direction.

This embodiment further provides an array substrate, and the array substrate is made by the above manufacturing method.

Second Embodiment

Figure 4A:
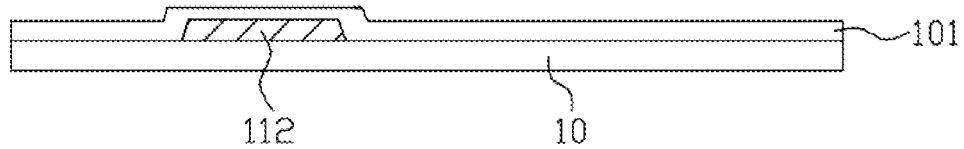
FIGS. 4a-4g are cross-sectional views when manufacturing the array substrate in the second embodiment of the present application.
Figure 5A:
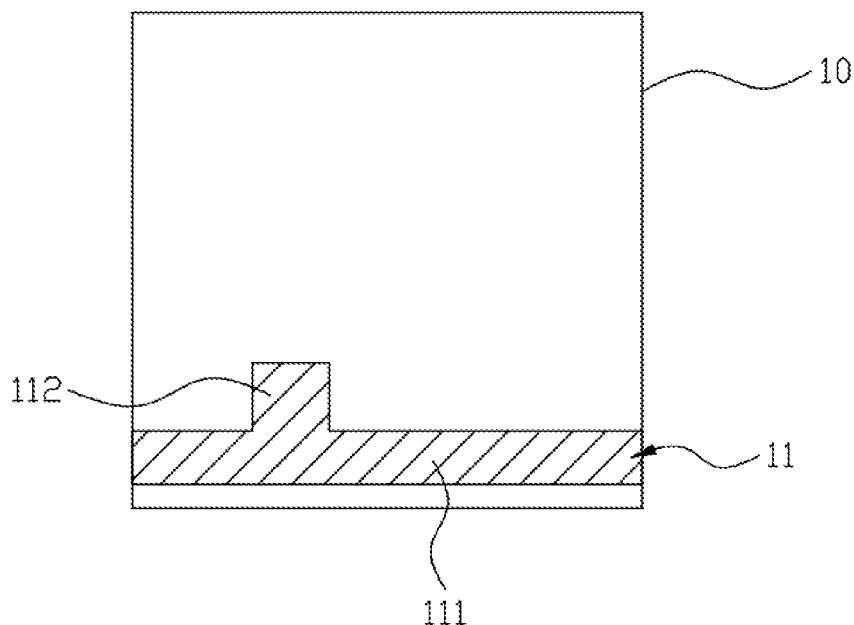
FIGS. 5a-5f are plan views when manufacturing the array substrate in the second embodiment of the present application.

FIGS. 4a-4g are cross-sectional views when manufacturing the array substrate in the second embodiment of the present application, and FIGS. 5a-5f are plan views when manufacturing the array substrate in the second embodiment of the present application. As shown in FIGS. 4a to 5f, the manufacturing method of an array substrate provided in the second embodiment of the present application includes:

As shown in FIGS. 4a and 5a, a substrate 10 is provided. The substrate 10 can be made of glass, quartz, silicon, acrylic acid, polycarbonate, etc., and the substrate 10 can also be a flexible substrate. Suitable materials for the flexible substrate include, for example, polyethersulfone (PES), polyethylene naphthalate (PEN), polyethylene (PE), polyimide (PI), polyvinyl chloride (PVC), polyethylene terephthalate (PET) or a combination thereof.

A first metal layer 11 (FIG. 5a) is formed on the substrate 10, and the first metal layer 11 is etched, such that the first metal layer 11 is patterned to form a scan line 111 (FIG. 5a) and a gate 112, and the gate is electrically connected with the scan line 111. The specific steps of etching the first metal layer 11 include: coating photoresist, exposing with a mask, developing, etching, and removing photoresist, etc. The first metal layer 11 can be made of metals, such as copper (Cu), silver (Ag), chromium (Cr), molybdenum (Mo), aluminum (Al), titanium (Ti), manganese (Mn), nickel (Ni), etc., or a combination of the above metals, such as Al/Mo, Cu/Mo, etc.

A first insulating layer 101 covering the scan line 111 and the gate 112 is formed on the substrate 10. The first insulating layer 101 is a gate insulating layer, and the first insulating layer 101 is arranged on the whole surface of the substrate 10 and covers the gate 112 and the scan line 111. The material of the first insulating layer 101 is silicon oxide (SiOx), silicon nitride (SiNx) or a combination of the two.

Figure 4B:
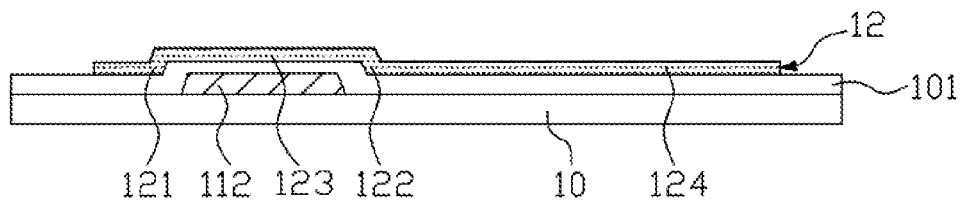
Figure 5B:
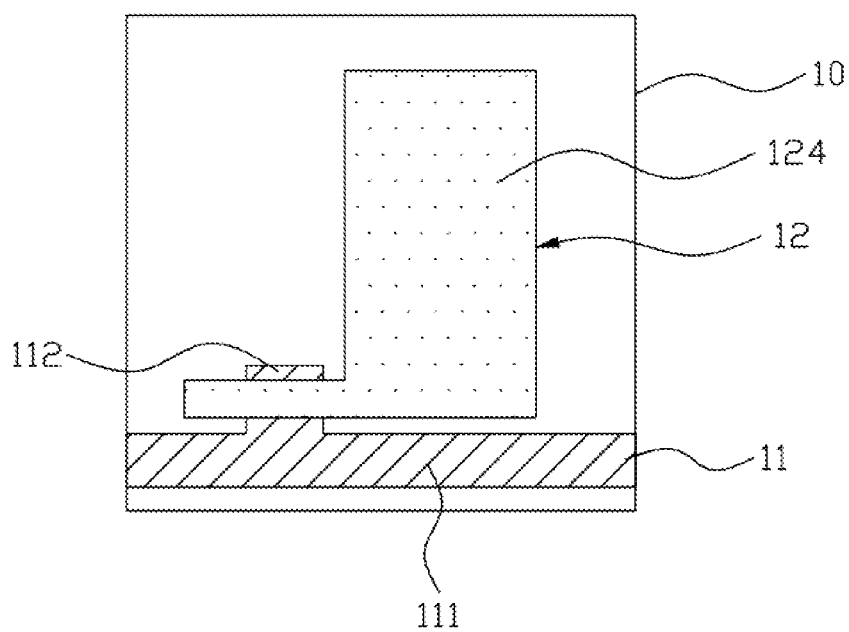

In this embodiment, as shown in FIGS. 4b and 5b, a metal oxide semiconductor layer 12 is formed on the upper surface of the first insulating layer 101, and the metal oxide semiconductor layer 12 is etched using an etching process, so that the metal oxide semiconductor layer 12 is patterned to form a source 121, a drain 122 and an active layer 123. The source 121 and the drain 122 are electrically connected through the active layer 123. The specific steps of etching the metal oxide semiconductor layer 12 include: coating photoresist, exposing with a mask, developing, etching, and removing photoresist, etc.

In this embodiment, the metal oxide semiconductor layer 12 is preferably made of transparent metal oxide semiconductor materials, such as indium zinc oxide (InZnO), indium gallium oxide (InGaO), indium tin oxide (InSnO), zinc tin oxide (ZnSnO), gallium tin oxide (GaSnO), gallium zinc oxide (GaZnO), indium gallium zinc oxide (IGZO) or indium gallium zinc oxide (IGZTO). When the metal oxide semiconductor layer 12 is etched, the metal oxide semiconductor layer 12 is also patterned to form a pixel electrode 124, and the pixel electrode 124 is directly electrically connected with the drain 122. That is, in this embodiment, the pixel electrode 124, the source 121, the drain 122 and the active layer 123 are located on the same layer, and are all formed by etching the metal oxide semiconductor layer 12.

Figure 4C:
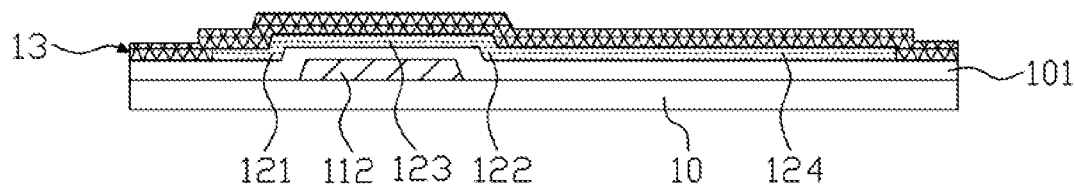

As shown in FIG. 4c, a photosensitive material layer 13 is coated on the upper surface of the etched metal oxide semiconductor layer 12. The photosensitive material layer 13 adopts positive photosensitive polyimide materials, such as positive photosensitive polyimide photoresist, and the thickness of the photosensitive material layer 13 is preferably 200 nm to 3000 nm. Specifically, the coating process is quite different from the chemical vapor deposition (CVD) process or plasma enhanced chemical vapor deposition (PECVD) process. The coating process is to cover the photosensitive material on the metal oxide semiconductor layer 12 by roller, rotary coating or other physical methods, which will not affect the properties of the metal oxide semiconductor layer 12, and is conducive to the TFT characteristics and stability not being affected by the environment.

Figure 4D:
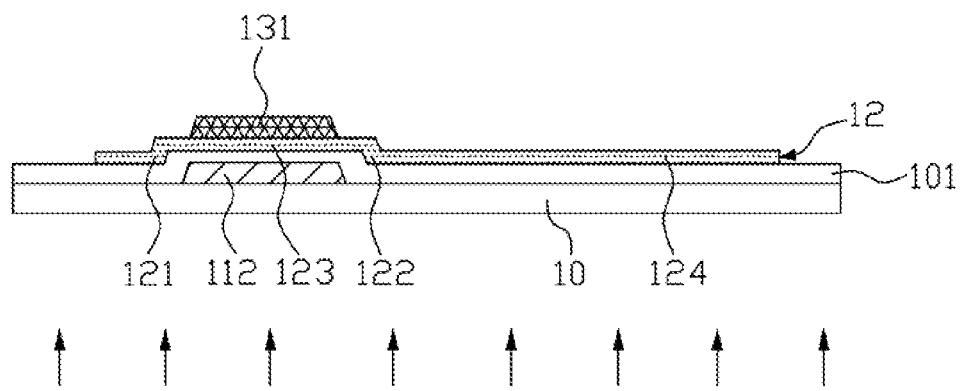
Figure 5C:
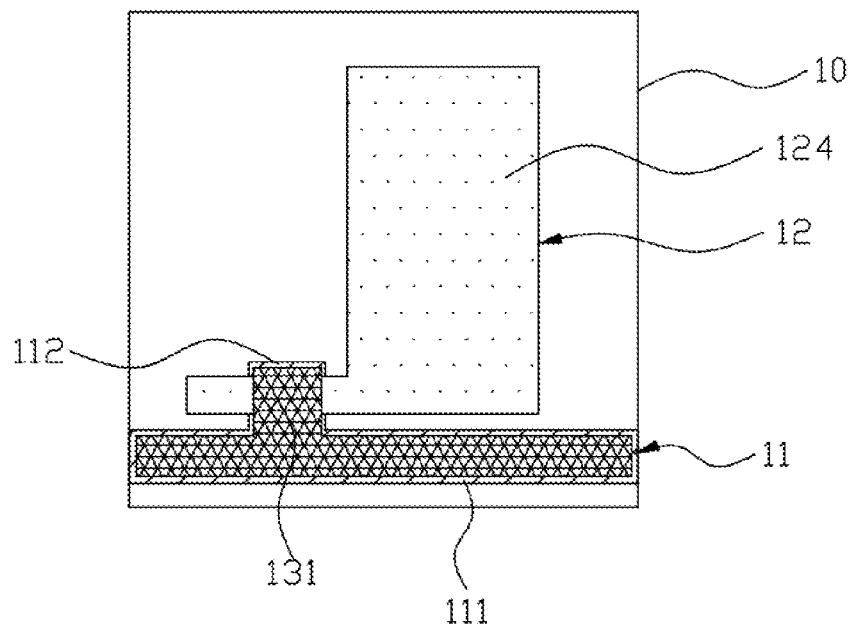

As shown in FIGS. 4d and 5c, the photosensitive material layer 13 is photoetched from the side of the substrate 10 away from the photosensitive material layer 13 (i.e., the back side of the substrate 10), with the gate 112 as a shelter, so that the photosensitive material layer 13 forms a channel protection layer 131 at the position corresponding to the gate 112. That is, the gate 112 is used as a shelter to photoetch the photosensitive material layer 13 from the side of the substrate 10 away from the photosensitive material layer 13, so that the photosensitive material layer 13 is patterned to form a channel protection layer 131. After the photoetching of the photosensitive material layer 13, the areas of the photosensitive material layer 13 corresponding to the positions of the source 121, the drain 122 and the pixel electrode 124 are removed, so that the source 121, the drain 122 and the pixel electrode 124 are exposed, but the active layer 123 is covered by the channel protection layer 131. In this embodiment, the gate 112 is used as a shelter, which can save a mask and simplify the manufacturing process. In addition, the gate 112 basically has no overlapping area with the source 121 or the drain 122, and the parasitic capacitance is small, which has less impact on the image display.

Figure 4E:
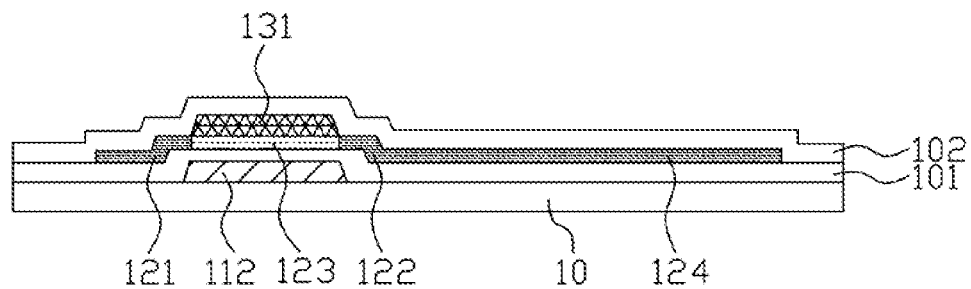
Figure 5D:
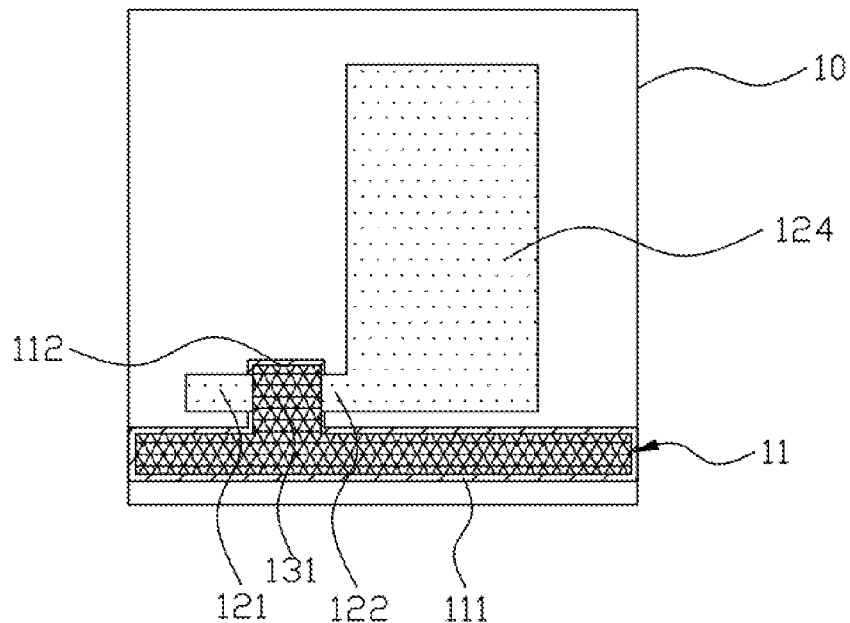

As shown in FIGS. 4e and 5d, a conductorization treatment is performed to the exposed area of the metal oxide semiconductor layer 12 (that is, the area not covered by the channel protection layer 131), so that the areas of the metal oxide semiconductor layer 12 corresponding to the source 121, the drain 122 and the pixel electrode 124 are made conductive. Specifically, with the channel protection layer 131 as the shelter, the exposed area of the metal oxide semiconductor layer 12 is executed by the conductorization treatment, so that the areas of the metal oxide semiconductor layer 12 corresponding to the source 121, the drain 122 and the pixel electrode 124 are made conductive.

In this embodiment, the specific steps of performing a conductorization treatment to the exposed area of the metal oxide semiconductor layer 12 include: after the photosensitive material layer 13 is patterned to form the channel protection layer 131, a chemical vapor deposition process (CVD, PECVD, ALD, etc.) is used to form a second insulating layer 102 on the upper surface of the metal oxide semiconductor layer 12. During the formation of the second insulating layer 102, hydrogen is introduced into the exposed area of the metal oxide semiconductor layer 12, so that the metal oxide semiconductor layer 12 not covered by the channel protection layer 131 is made conductive by hydrogen doping, that is, the source 121, the drain 122 and the pixel electrode 124 are made conductive. In the process of forming the second insulating layer 102, the source 121, the drain 122 and the pixel electrode 124 are made conductive, so that the production process is simplified.

In other embodiments, referring to the first embodiment described above, the specific steps of performing a conductorization treatment to the exposed area of the metal oxide semiconductor layer 12 include: using the channel protection layer 131 as a shelter, applying a plasma treatment to the exposed area of the metal oxide semiconductor layer 12, so that the metal oxide semiconductor layer 12 not covered by the channel protection layer 131 is made conductive through ion bombardment or hydrogen doping, that is, the source 121, the drain 122 and the pixel electrode 124 are made conductive.

Since the active layer 123 is covered by the channel protection layer 131, and the channel protection layer 131 has a good hydrogen blocking ability, which is conducive to avoiding the introduction of hydrogen into the active layer 123 during the process of making the metal oxide semiconductor layer 12 conductive, thereby preventing the active layer 123 from being conductive.

Figure 4F:
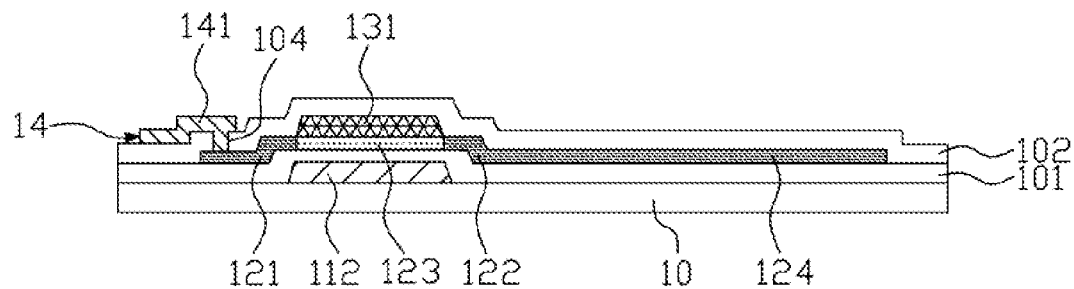
Figure 5E:
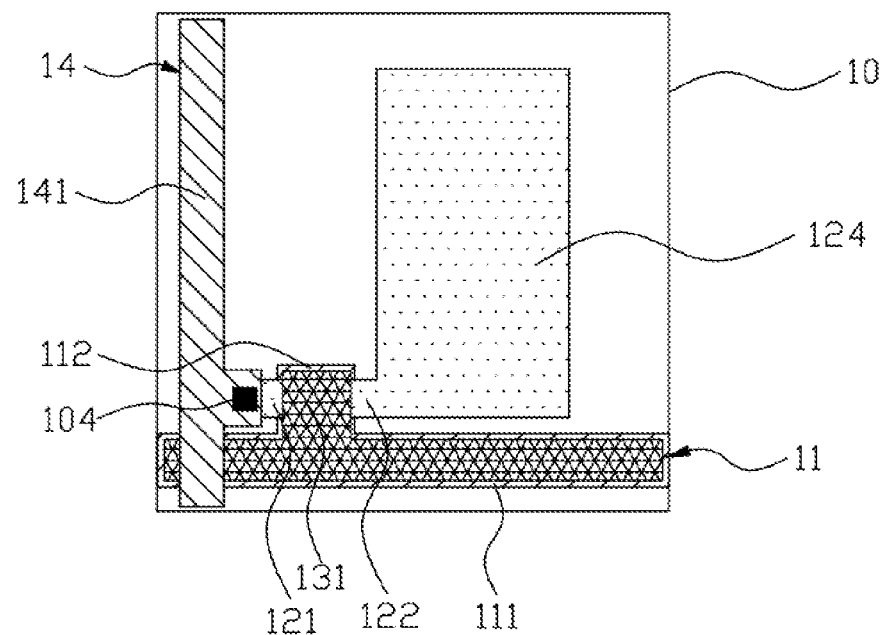

As shown in FIGS. 4f and 5e, after performing the conductorization treatment to the metal oxide semiconductor layer 12, a second metal layer 14 is formed above the metal oxide semiconductor layer 12, the second metal layer 14 is etched and patterned to form a data line 141, and the data line 141 is electrically connected with the source 121. Specifically, after performing the conductorization treatment to the metal oxide semiconductor layer 12, a second insulating layer 102 is formed on the first insulating layer 101, and the second insulating layer 102 covers the upper surfaces of the channel protection layer 131, the source 121, the drain 122, the pixel electrode 124 and the first insulating layer 101; then, the second insulating layer 102 is etched at the position corresponding to the source 121, so that the second insulating layer 102 forms a contact hole 104 at the position corresponding to the source 121; thereafter, a second metal layer 14 is formed on the upper surface of the second insulating layer 102, the second metal layer 14 is filled into the contact hole 104 and contacts the source 121, the second metal layer 14 is etched and patterned to form a data line 141, and the data line 141 is electrically connected with the source 121. Specifically, the second metal layer 14 can be made of metals, such as copper (Cu), silver (Ag), chromium (Cr), molybdenum (Mo), aluminum (Al), titanium (Ti), manganese (Mn), nickel (Ni), etc., or a combination of the above metals, such as Al/Mo, Cu/Mo, etc. The second insulating layer 102 is made of silicon oxide (SiOx), silicon nitride (SiNx) or a combination of the two. The specific steps of etching the second insulating layer 102 and the second metal layer 14 include: coating photoresist, exposing with a mask, developing, etching, and removing photoresist, etc.

Figure 4G:
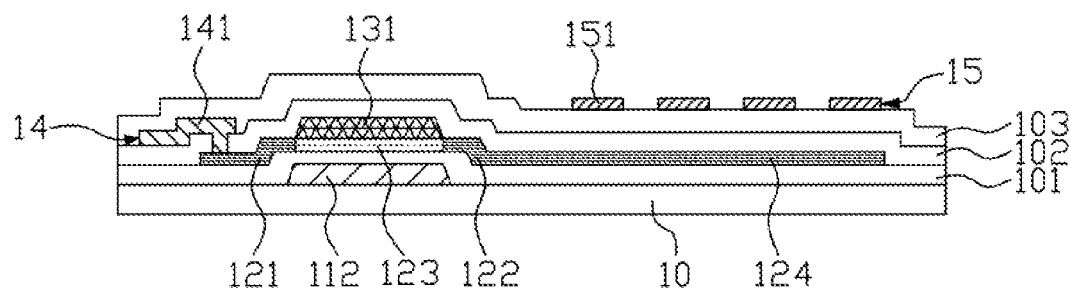
Figure 5F:
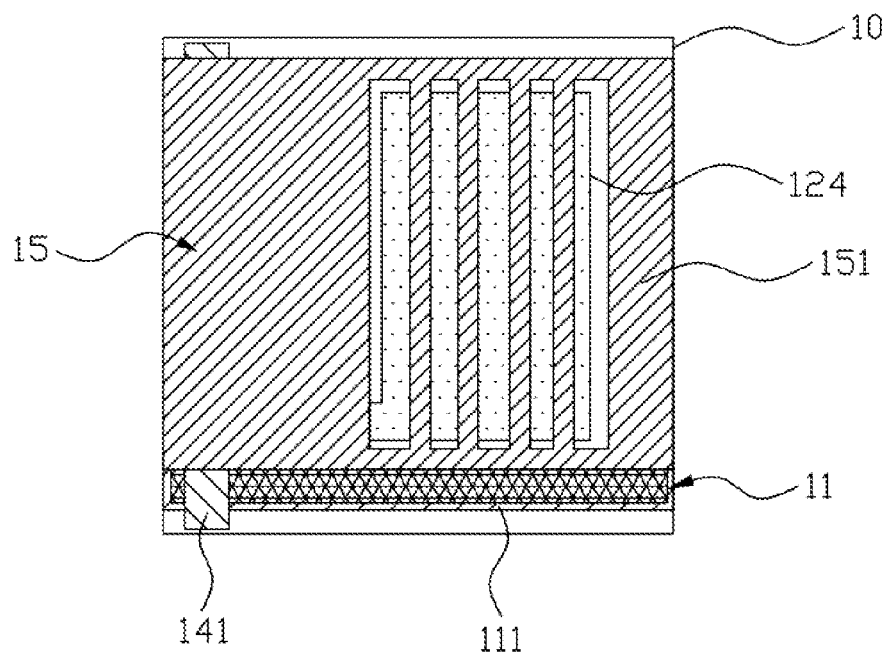

As shown in FIGS. 4g and 5f, a third insulating layer 103 is formed on the upper surface of the second insulating layer 102, and the third insulating layer 103 covers the data line 141. Then, a transparent conductive layer 15 is formed on the third insulating layer 103, and the transparent conductive layer 15 is etched to form a common electrode 151, and the common electrode 151 is insulated from the pixel electrode 124. Specifically, the common electrode 151 has a slit structure in the area corresponding to the pixel electrode 124, and the common electrode 151 and the pixel electrode 124 are separated from each other by the second insulating layer 102 and the third insulating layer 103, so that the array substrate can be applied to the display of fringe field switching (FFS) mode. Specifically, the material of the third insulating layer 103 is silicon oxide (SiOx), silicon nitride (SiNx) or a combination of the two. The transparent conductive layer 15 is made of indium tin oxide (ITO), indium zinc oxide (IZO), cadmium tin oxide (CTO), aluminum zinc oxide (AZO), indium tin zinc oxide (ITZO), zinc oxide (ZnO), cadmium oxide (CdO), hafnium oxide (HfO), indium gallium zinc oxide (InGaZnO), indium gallium zinc magnesium oxide (InGaZnMgO), indium gallium magnesium oxide (InGaMgO) or indium gallium aluminum oxide (InGaAlO). The specific steps of etching the transparent conductive layer 15 include: coating photoresist, exposing with a mask, developing, etching, and removing photoresist, etc.

In other embodiments, the common electrode 151 can also be set on the lower side of the pixel electrode 124. Alternatively, it is not necessary to set a common electrode 151 on the array substrate, so that the array substrate can be suitable for the display of TN or VA mode.

This embodiment further provides an array substrate, and the array substrate is made by the above manufacturing method.

Third Embodiment

Figure 6:
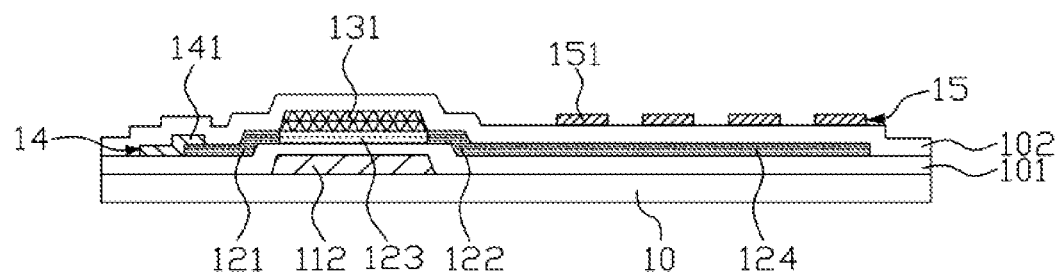
FIG. 6 is a cross-sectional view of the array substrate in the third embodiment of the present application.

FIG. 6 is a cross-sectional view of the array substrate in the third embodiment of the present application. As shown in FIG. 6, the manufacturing method of the array substrate provided in the third embodiment of the present application is basically the same as that of the array substrate in the first embodiment (FIGS. 1 to 3f) or the second embodiment (FIGS. 4a to 5f). The difference is that, in this embodiment, after performing the conductorization treatment to the metal oxide semiconductor layer 12, a second metal layer 14 is formed on the metal oxide semiconductor layer 12, the second metal layer 14 is etched and patterned to form a data line 141, and the data line 141 is electrically connected with the source 121. Specifically, after performing the conductorization treatment to the metal oxide semiconductor layer 12, a second metal layer 14 is formed on the upper surface of the first insulating layer 101. The second metal layer 14 covers the upper surfaces of the channel protection layer 131, the source 121, the drain 122, the pixel electrode 124 and the first insulating layer 101. The second metal layer 14 directly contacts the source 121. The second metal layer 14 is etched and patterned to form a data line 141, and the data line 141 is directly electrically connected with the source 121.

Then, a second insulating layer 102 is formed on the upper surface of the first insulating layer 101, the second insulating layer 102 covers the upper surfaces of the channel protection layer 131, the source 121, the drain 122, the pixel electrode 124, the first insulating layer 101 and the data line 141.

This embodiment further provides an array substrate, and the array substrate is made by the above manufacturing method.

Compared with the first embodiment or the second embodiment, in this embodiment, the data line 141 is made first, and then the second insulating layer 102 is formed, so there is no need to etch the second insulating layer 102 to form a contact hole 104, and there is no need to cover a third insulating layer 103 on the second insulating layer 102, so as to further simplify the production process and save the production cost.

It is understood by those skilled in the art that the remaining structure and working principle of this embodiment are the same as those of the first embodiment or the second embodiment, and will not be repeated here.

Fourth Embodiment

Figure 7:
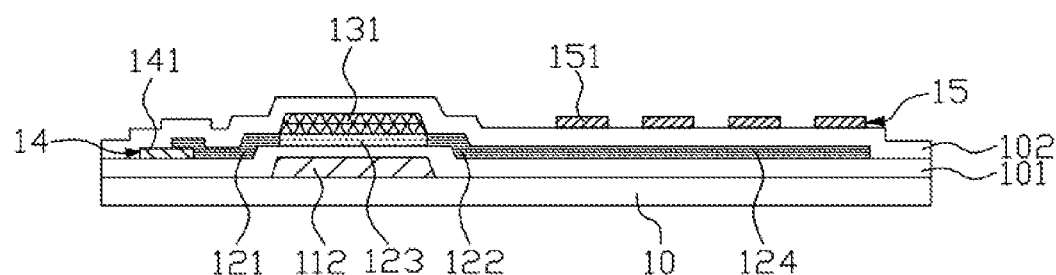
FIG. 7 is a cross-sectional view of the array substrate in the fourth embodiment of the present application.

FIG. 7 is a cross-sectional view of the array substrate in the fourth embodiment of the present application. As shown in FIG. 7, the manufacturing method of the array substrate provided in the fourth embodiment of the present application is basically the same as that of the array substrate in the first embodiment (FIG. 1 to FIG. 3f) or the second embodiment (FIG. 4a to FIG. 5f). The difference is that, in this embodiment, before forming the metal oxide semiconductor layer 12 on the upper surface of the first insulating layer 101, a second metal layer 14 is formed on the upper surface of the first insulating layer 101, and the second metal layer 14 is etched and patterned to form a data line 141.

After forming the data line 141, then a metal oxide semiconductor layer 12 is formed on the upper surface of the first insulating layer 101. The metal oxide semiconductor layer 12 covers the data line 141. Then, the metal oxide semiconductor layer 12 is etched, so that the metal oxide semiconductor layer 12 is patterned to form a source 121, a drain 122, an active layer 123 and a pixel electrode 124. The source 121 and the drain 122 are electrically connected through the active layer 123. The drain 122 is electrically connected with the pixel electrode 124, and the source 121 is electrically connected with the data line 141.

This embodiment further provides an array substrate, and the array substrate is made by the above manufacturing method.

Compared with the first embodiment or the second embodiment, in this embodiment, the data line 141 is made first, and then the metal oxide semiconductor layer 12 is formed, so there is no need to etch the second insulating layer 102 to form a contact hole 104, and there is no need to cover a third insulating layer 103 on the second insulating layer 102, so as to further simplify the production process and save the production cost.

It is understood by those skilled in the art that the remaining structure and working principle of this embodiment are the same as those of the first embodiment or the second embodiment, and will not be repeated here.

Fifth Embodiment

Figure 8:
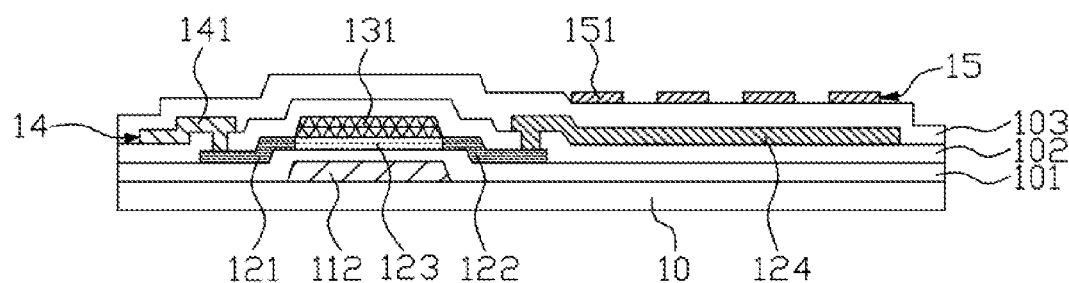
FIG. 8 is a cross-sectional view of the array substrate in the fifth embodiment of the present application.

FIG. 8 is a cross-sectional view of the array substrate in the fifth embodiment of the present application. As shown in FIG. 8, the manufacturing method of the array substrate provided in the fifth embodiment of the present application is basically the same as that of the array substrate in the first embodiment (FIGS. 1 to 3f) or the second embodiment (FIGS. 4a to 5f). The difference is that, in this embodiment, after the second insulating layer 102 is formed on the first insulating layer 101, the second insulating layer 102 is etched and perforated with an opening at the position corresponding to the drain 122, so that the drain 122 is exposed from the opening.

Then, a transparent conductive material layer is formed on the upper surface of the second insulating layer 102, the transparent conductive material layer is etched to form a pixel electrode 124, and the pixel electrode 124 is electrically connected with the drain 122 through the opening. The transparent conductive material is, for example, indium tin oxide (ITO), indium zinc oxide (IZO), cadmium tin oxide (CTO), aluminum zinc oxide (AZO), indium tin zinc oxide (ITZO), zinc oxide (ZnO), cadmium oxide (CdO), hafnium oxide (HfO), indium gallium zinc oxide (InGaZnO), indium gallium zinc magnesium oxide (InGaZnMgO), indium gallium magnesium oxide (InGaMgO) or indium gallium aluminum oxide (InGaAlO).

This embodiment further provides an array substrate, and the array substrate is made by the above manufacturing method.

Compared with the first embodiment or the second embodiment, in this embodiment, an additional layer of transparent conductive material is provided and used to make the pixel electrode 124. When etching the metal oxide semiconductor layer 12, the metal oxide semiconductor layer 12 does not need to form the pixel electrode 124, so that the distance between the pixel electrode 124 and the common electrode 151 is smaller, and it is easier to form a driving electric field and save driving power consumption.

It is understood by those skilled in the art that the remaining structure and working principle of this embodiment are the same as those of the first embodiment or the second embodiment, and will not be repeated here.

Figure 9:
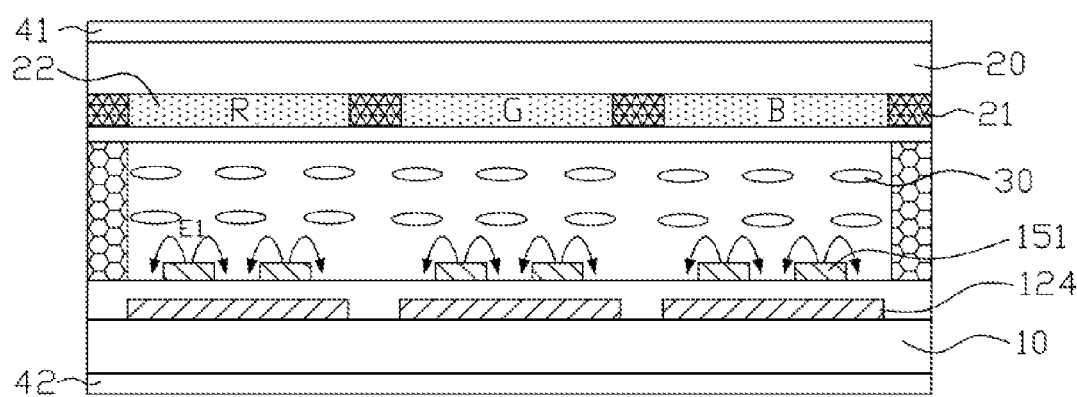
FIG. 9 is a cross-sectional view of the display panel in the present application.

FIG. 9 is a cross-sectional view of the display panel in the present application. As shown in FIG. 9, the present application further provides a display panel including an array substrate, an opposite substrate 20 disposed opposite to the array substrate, and a liquid crystal layer 30 arranged between the array substrate and the opposite substrate 20. The array substrate is made by the above manufacturing method. The opposite substrate 20 is provided with an upper polarizer 41, and the array substrate is provided with a lower polarizer 42. The light transmission axis of the upper polarizer 41 is perpendicular to the light transmission axis of the lower polarizer 42. Specifically, the liquid crystal molecules in the liquid crystal layer 30 are positive liquid crystal molecules (that is, liquid crystal molecules with positive dielectric anisotropy). In the initial state, the positive liquid crystal molecules are in a lying posture, and the alignment direction of the positive liquid crystal molecules adjacent to the opposite substrate 20 is parallel to the alignment direction of the positive liquid crystal molecules 131 adjacent to the array substrate. It can be understood that the array substrate and the opposite substrate 20 are further provided with an alignment layer on the inner side towards the liquid crystal layer 30, so as to align the positive liquid crystal molecules in the liquid crystal layer 30.

In this embodiment, the opposite substrate 20 is a color film substrate. The opposite substrate 20 is provided with a black matrix 21 and a plurality of color resistor layers 22. The black matrix 21 is aligned with the scan line 111, the data line 141, the thin film transistor and the peripheral non-display area. The black matrix 21 separates the plurality of color resistor layers 22. The color resistor layers 22 include resist materials of three colors, i.e., red (R), green (G) and blue (B), so as to form sub-pixels of red (R), green (G), and blue (B) correspondingly.

In this description, the directional terms such as "up", "down", "left", "right", "front" and "back" are defined by the positions of the structures in the drawings and the positions between the structures, and are only for clearly and conveniently expressing technical solutions. It should be understood that the use of the directional terms should not limit the scope of protection claimed in this application. It should also be understood that the terms "first" and "second", etc. used herein are only used to distinguish elements, and are not used to limit the number and order.

The above descriptions are only preferred embodiments of the present application, and do not limit the present application in any form. Although the present application has been disclosed above with preferred embodiments, it is not intended to limit the present application. The persons skilled in the art may make some changes or modifications by using the technical content disclosed above, and if they do not depart from the technical content of the present application, any simple modifications, equivalent changes and modifications made to the above embodiments still fall within the protection scope of the technical solution of the present application.

INDUSTRIAL APPLICABILITY

The channel protection layer is made of a photosensitive material. The formation of the photosensitive material layer only requires the coating process, not the chemical vapor deposition process. When the photosensitive material layer is coated, the performance of the active layer is not affected, which is beneficial for maintaining the TFT characteristics and stability in different environments. In addition, the first metal layer is used as a mask to photoetch the photosensitive material layer from the back side of the substrate, and no additional mask is required, so that the manufacturing process is simple, the gate and the source/drain basically have no overlapping area, and the parasitic capacitance is small, which has less impact on the image display.

What is claimed is:

1. A manufacturing method of an array substrate, comprising:
   providing a substrate;
   forming a first metal layer on the substrate, and etching the first metal layer, such that the first metal layer is patterned to form a scan line and a gate, and the gate is electrically connected with the scan line;
   forming a first insulating layer covering the scan line and the gate on the substrate;

forming a metal oxide semiconductor layer on the first insulating layer;

before the metal oxide semiconductor layer is etched, coating a photosensitive material layer on an upper surface of the metal oxide semiconductor layer;

using a mask over the photosensitive material layer to photoetch the photosensitive material layer for the first time, such that the photosensitive material layer is patterned to form an etching stopper layer;

using the etching stopper layer as a shelter to etch the metal oxide semiconductor layer, such that the metal oxide semiconductor layer is patterned to form a source, a drain and an active layer, wherein the source and the drain are electrically connected through the active layer;

using the gate as a shelter to photoetch the photosensitive material layer for the second time from the side of the substrate away from the photosensitive material layer, such that the photosensitive material layer is finally patterned to form a channel protection layer;

performing a conductorization treatment to the exposed area of the metal oxide semiconductor layer by using the channel protection layer as a shelter, such that the areas of the metal oxide semiconductor layer corresponding to the source and the drain are made conductive;

forming a second metal layer above the first insulating layer, and etching the second metal layer, such that the second metal layer is patterned to form a data line, and the data line is electrically connected with the source;

forming a pixel electrode above the first insulating layer, wherein the pixel electrode is electrically connected with the drain.

2. The manufacturing method of the array substrate according to claim 1, wherein the specific steps of performing the conductorization treatment to the exposed area of the metal oxide semiconductor layer comprise:

a plasma treatment is applied to the exposed area of the metal oxide semiconductor layer by using the channel protection layer as a shelter, such that the metal oxide semiconductor layer not covered by the channel protection layer is made conductive through ion bombardment or hydrogen doping.

3. The manufacturing method of the array substrate according to claim 1, wherein the specific steps of performing the conductorization treatment to the exposed area of the metal oxide semiconductor layer comprise:

after the photosensitive material layer is patterned to form the channel protection layer, a chemical vapor deposition process is used to form a second insulating layer on the upper surface of the metal oxide semiconductor layer, and during the formation of the second insulating layer, hydrogen is introduced into the exposed area of the metal oxide semiconductor layer, such that the areas of the metal oxide semiconductor layer contacting with the second insulating layer are made conductive by hydrogen doping.

4. The manufacturing method of the array substrate according to claim 1, wherein the metal oxide semiconductor layer is made of transparent metal oxide semiconductor material, when the metal oxide semiconductor layer is etched, the metal oxide semiconductor layer is also patterned to form the pixel electrode, such that the pixel electrode, the source, the drain and the active layer are located on the same layer and are all formed by etching the metal oxide semiconductor layer, and the pixel electrode is electrically connected with the drain;

when performing the conductorization treatment to the exposed area of the metal oxide semiconductor layer, the areas of the metal oxide semiconductor layer corresponding to the source, the drain and the pixel electrode are made conductive.

5. The manufacturing method of the array substrate according to claim 1, wherein the pixel electrode and the metal oxide semiconductor layer are located on different layers.

6. The manufacturing method of the array substrate according to claim 1, wherein before forming the metal oxide semiconductor layer on the first insulating layer, the second metal layer is formed on an upper surface of the first insulating layer, and the second metal layer is etched and patterned to form the data line;

after forming the data line, the metal oxide semiconductor layer is formed on the upper surface of the first insulating layer, and the metal oxide semiconductor layer covers the data line;

the metal oxide semiconductor layer is etched such that the metal oxide semiconductor layer is patterned to form the source, the drain and the active layer, wherein the source and the drain are electrically connected through the active layer, and the source is electrically connected with the data line.

7. The manufacturing method of the array substrate according to claim 1, wherein after performing the conductorization treatment to the exposed area of the metal oxide semiconductor layer, the second metal layer is formed on the upper surface of the metal oxide semiconductor layer, the second metal layer is etched and patterned to form the data line, wherein the data line is electrically connected with the source.

8. The manufacturing method of the array substrate according to claim 1, wherein after performing the conductorization treatment to the exposed area of the metal oxide semiconductor layer, a second insulating layer is formed on the upper surface of the metal oxide semiconductor layer;

the second metal layer is formed on an upper surface of the second insulating layer, the second metal layer is etched and patterned to form the data line, wherein the data line is electrically connected with the source.

9. The manufacturing method of the array substrate according to claim 1, wherein a transparent conductive layer is formed above the first insulating layer, and the transparent conductive layer is etched such that the transparent conductive layer forms a common electrode, wherein the common electrode and the pixel electrode are mutually insulated.

10. The manufacturing method of the array substrate according to claim 9, wherein the common electrode is located above the pixel electrode, and the common electrode has a slit structure.

11. An array substrate made by the manufacturing method according to claim 1.

12. A display panel comprising the array substrate according to claim 11, an opposite substrate disposed opposite to the array substrate, and a liquid crystal layer arranged between the array substrate and the opposite substrate.

13. The manufacturing method of the array substrate according to claim 1, wherein the photosensitive material layer is made of positive photosensitive polyimide materials, such that the photoetching of the photosensitive material layer for the first time and for the second time requires only exposure and development processes, without additional processes of coating photoresist and removing photoresist.

14. A manufacturing method of an array substrate, comprising:
provided a substrate;
forming a first metal layer on the substrate, and etching the first metal layer, such that the first metal layer is patterned to form a scan line and a gate, and the gate is electrically connected with the scan line;
forming a first insulating layer covering the scan line and the gate on the substrate;
forming a metal oxide semiconductor layer on the first insulating layer, and etching the metal oxide semiconductor layer, such that the metal oxide semiconductor layer is patterned to form a source, a drain and an active layer, wherein the source and the drain are electrically connected through the active layer;
after the metal oxide semiconductor layer is etched, coating a photosensitive material layer on an upper surface of the metal oxide semiconductor layer;
using the gate as a shelter to photoetch the photosensitive material layer from the side of the substrate away from the photosensitive material layer, such that the photosensitive material layer is patterned to form a channel protection layer;
performing a conductorization treatment to the exposed area of the metal oxide semiconductor layer by using the channel protection layer as a shelter, such that the areas of the metal oxide semiconductor layer corresponding to the source and the drain are made conductive;
forming a second metal layer above the first insulating layer, and etching the second metal layer, such that the second metal layer is patterned to form a data line, and the data line is electrically connected with the source;
forming a pixel electrode above the first insulating layer, wherein the pixel electrode is electrically connected with the drain.

15. The manufacturing method of the array substrate according to claim 14, wherein the metal oxide semiconductor layer is made of transparent metal oxide semiconductor material, when the metal oxide semiconductor layer is etched, the metal oxide semiconductor layer is also patterned to form the pixel electrode, such that the pixel electrode, the source, the drain and the active layer are located on the same layer and are all formed by etching the metal oxide semiconductor layer, and the pixel electrode is electrically connected with the drain;
when performing the conductorization treatment to the exposed area of the metal oxide semiconductor layer, the areas of the metal oxide semiconductor layer corresponding to the source, the drain and the pixel electrode are made conductive.

16. The manufacturing method of the array substrate according to claim 14, wherein the pixel electrode and the metal oxide semiconductor layer are located on different layers.

17. The manufacturing method of the array substrate according to claim 14, wherein before forming the metal oxide semiconductor layer on the first insulating layer, the second metal layer is formed on an upper surface of the first insulating layer, and the second metal layer is etched and patterned to form the data line;
after forming the data line, the metal oxide semiconductor layer is formed on the upper surface of the first insulating layer, and the metal oxide semiconductor layer covers the data line;
the metal oxide semiconductor layer is etched such that the metal oxide semiconductor layer is patterned to form the source, the drain and the active layer, wherein the source and the drain are electrically connected through the active layer, and the source is electrically connected with the data line.

18. The manufacturing method of the array substrate according to claim 14, wherein after performing the conductorization treatment to the exposed area of the metal oxide semiconductor layer, the second metal layer is formed on the upper surface of the metal oxide semiconductor layer, the second metal layer is etched and patterned to form the data line, wherein the data line is electrically connected with the source.

19. The manufacturing method of the array substrate according to claim 14, wherein after performing the conductorization treatment to the exposed area of the metal oxide semiconductor layer, a second insulating layer is formed on the upper surface of the metal oxide semiconductor layer;
the second metal layer is formed on an upper surface of the second insulating layer, the second metal layer is etched and patterned to form the data line, wherein the data line is electrically connected with the source.

20. The manufacturing method of the array substrate according to claim 14, wherein the photosensitive material layer is made of positive photosensitive polyimide materials, such that the photoetching of the photosensitive material layer requires only exposure and development processes, without additional processes of coating photoresist and removing photoresist.

* * * * *